(12) United States Patent
Tsuda

(10) Patent No.: US 8,692,440 B2
(45) Date of Patent: Apr. 8, 2014

(54) PIEZOELECTRIC DEVICE AND MANUFACTURING METHOD THEREFOR

(75) Inventor: Toshimasa Tsuda, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 59 days.

(21) Appl. No.: 13/417,698

(22) Filed: Mar. 12, 2012

(65) Prior Publication Data

US 2012/0248933 A1    Oct. 4, 2012

(30) Foreign Application Priority Data

Mar. 30, 2011  (JP) ................................. 2011-076577
Dec. 27, 2011  (JP) ................................. 2011-285386

(51) Int. Cl.
    *H01L 41/08* (2006.01)
(52) U.S. Cl.
    USPC ...................................... 310/313 R; 310/344
(58) Field of Classification Search
    USPC ............................................ 310/313 R, 344
    See application file for complete search history.

(56) References Cited

U.S. PATENT DOCUMENTS

| | | | | |
|---|---|---|---|---|
| 5,162,822 A | * | 11/1992 | Wakamori | 333/193 |
| 5,252,882 A | * | 10/1993 | Yatsuda | 310/313 R |
| 7,484,279 B2 | * | 2/2009 | Aoki | 29/25.35 |
| 7,656,070 B2 | * | 2/2010 | Kadota et al. | 310/313 R |
| 7,944,125 B2 | * | 5/2011 | Takada et al. | 310/348 |
| 8,256,275 B2 | * | 9/2012 | Yamada et al. | 73/64.53 |
| 8,384,272 B2 | * | 2/2013 | Fukano et al. | 310/344 |

FOREIGN PATENT DOCUMENTS

| | | |
|---|---|---|
| JP | 2007-081867 | 3/2007 |
| JP | 2009-225256 | 10/2009 |
| JP | 2010-010812 | 1/2010 |

\* cited by examiner

*Primary Examiner* — Mark Budd
(74) *Attorney, Agent, or Firm* — Edwards Wildman Palmer LLP; Scott D. Wofsy; Christopher J. Capelli

(57) ABSTRACT

A manufacturing method, which realizes general versatility of an external connection terminal by reducing deterioration of characteristics and a decrease in yield rate of a piezoelectric device in an external connection terminal forming process, and a piezoelectric device manufactured by this method are provided. Before a piezoelectric device is sealed together with a ceiling layer to form a package, an electrode structure serving as an external connection terminal is provided beforehand on a substrate mounted with a key area of the device, and after formation of the key area of the device, the piezoelectric device is sealed and packaged together with the ceiling layer. The piezoelectric device of the present invention can accommodate a three-dimensional structure by providing a rewiring layer on a principal surface of the substrate.

2 Claims, 15 Drawing Sheets

FIG.6
(e) SANDBLASTING
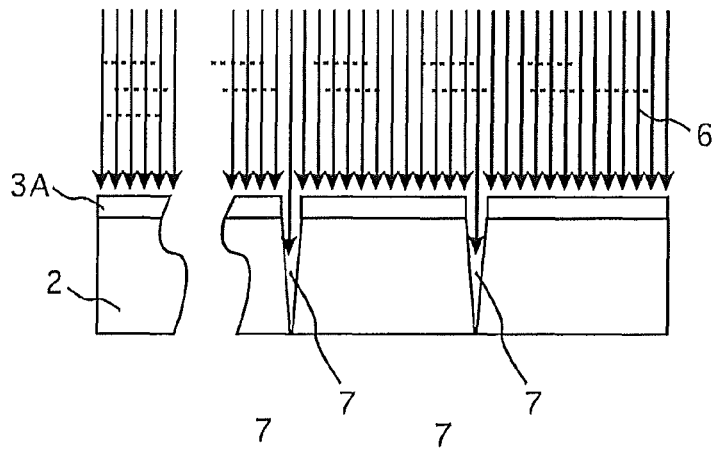
(f) REMOVE RESIST
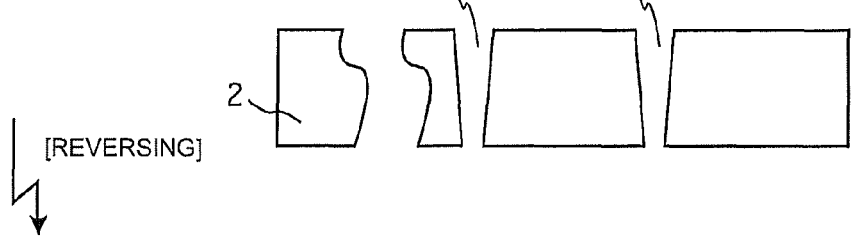
[REVERSING]
(g) ATTACH PROTECTIVE FILM
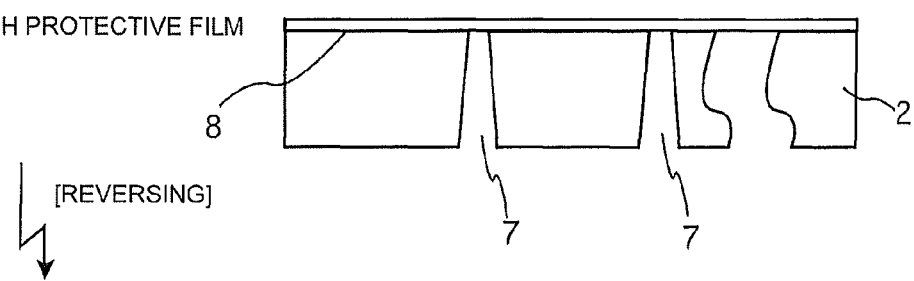
[REVERSING]
(h) FORM SEED LAYER
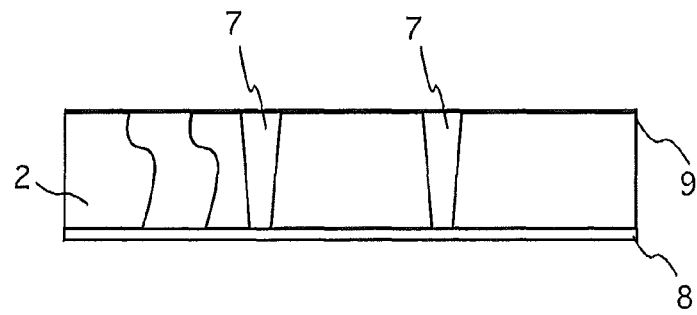

FIG.7
(i) APPLY PHOTORESIST AND PERFORM EXPOSURE
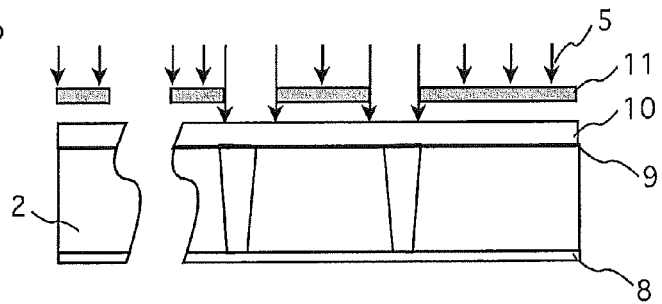
(j) FORM RESIST PATTERN BY DEVELOPMENT
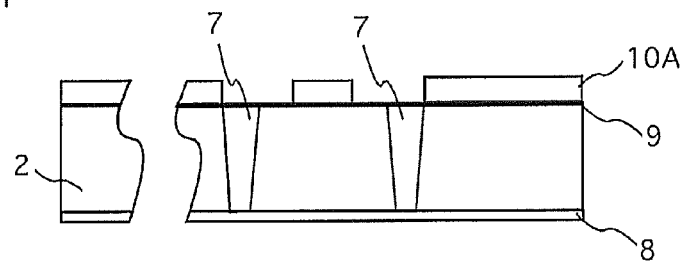
(k) PLATING
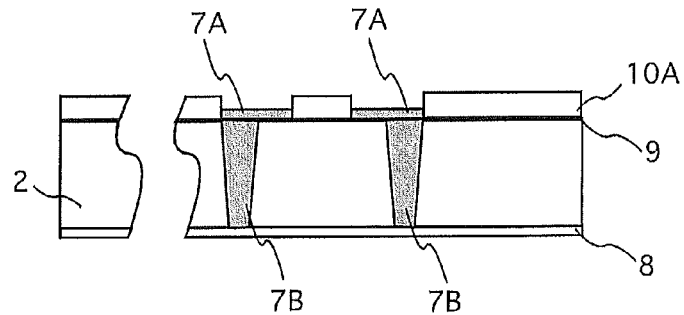
(l) REMOVE PHOTORESIST
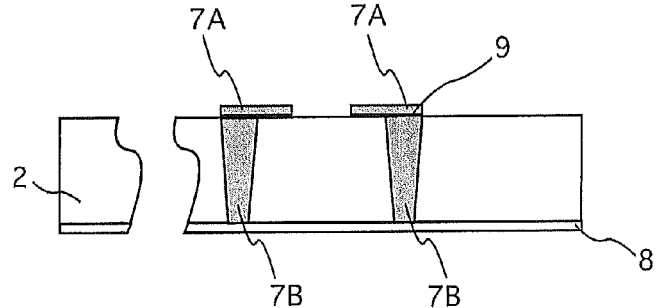

FIG.8
(m) FORM THROUGH-HOLE ELECTRODE
POST /EXTERNAL CONNECTION TERMINAL
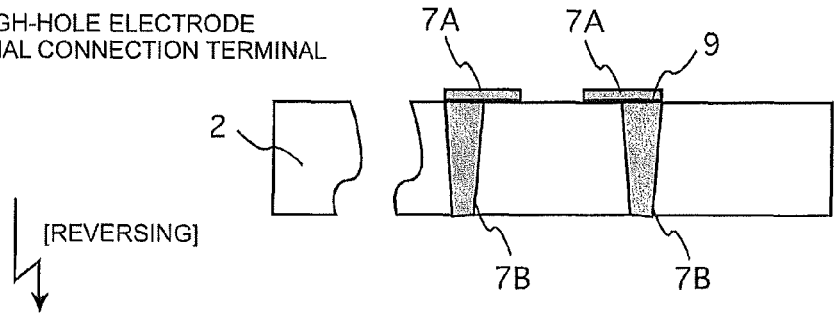
[REVERSING]
(n) FORM THIRD PHOTORESIST LAYER
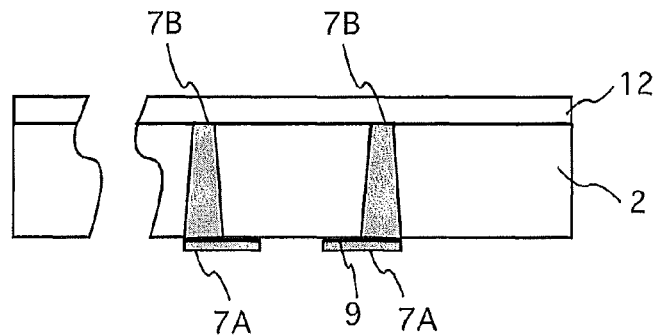
(o) PERFORM EXPOSURE VIA EXPOSURE
MASK HAVING COMB-SHAPED
ELECTRODES OPENING PATTERN
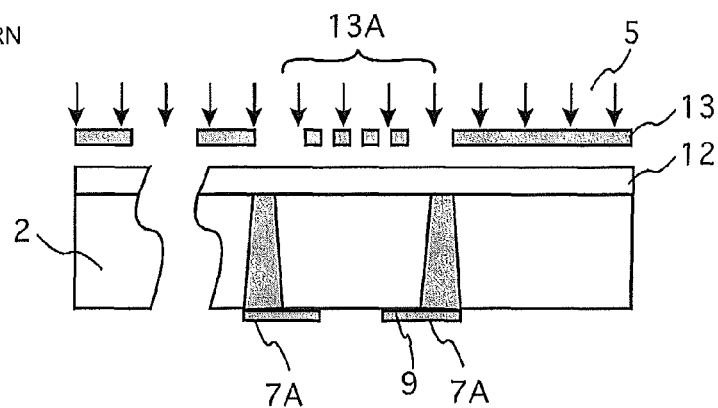

FIG.9
(p) FORM RESIST PATTERN BY DEVELOPMENT
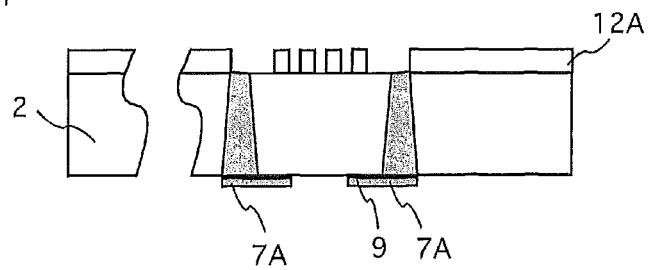
(q) VAPOR-DEPOSIT METAL LAYER
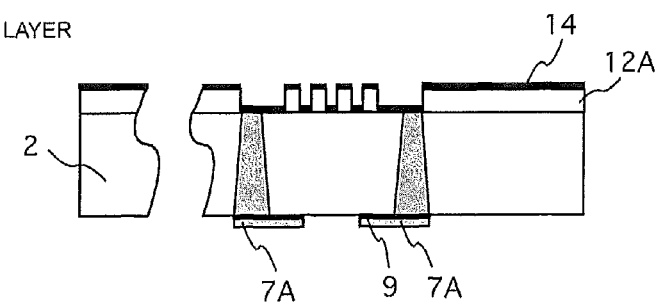
(r) REMOVE RESIST PATTERN BY LIFTOFF
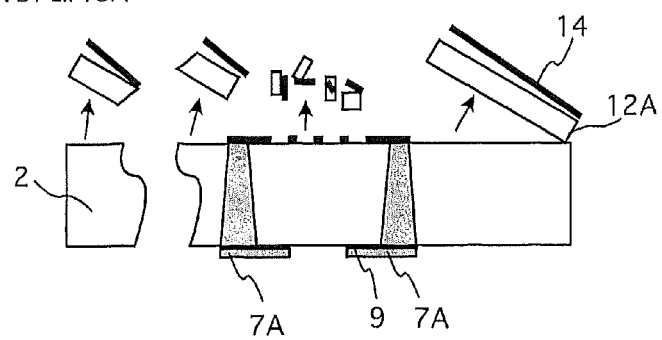
(s) FORM COMB-SHAPED ELECTRODES
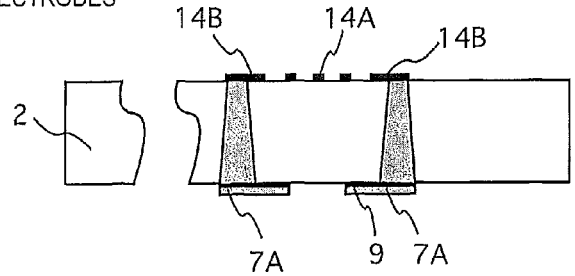

FIG. 10
(t) FORM PROTECTIVE FILM
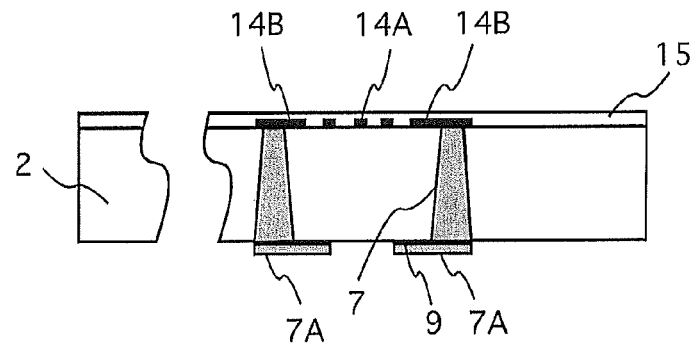
(u) FORM PHOTORESIST AND EXPOSE PHOTORESIST VIA EXPOSURE MASK HAVING EXTERNAL PERIPHERAL WALL OPENING PATTERN
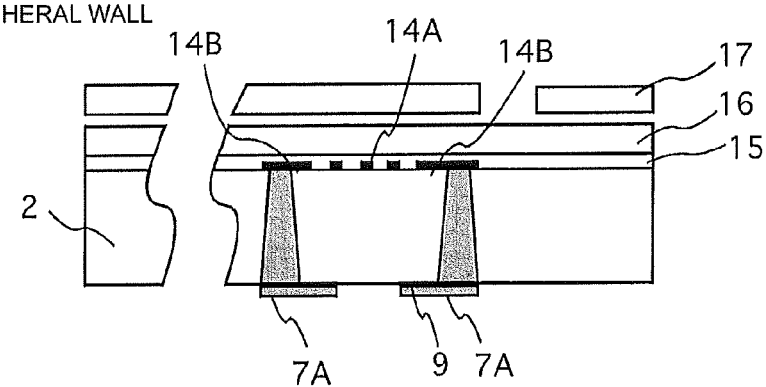
(v) FORM EXTERNAL PERIPHERAL WALL BY DEVELOPMENT
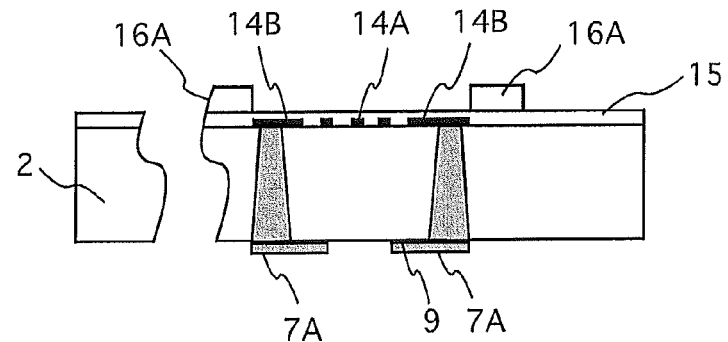

(w) PERFORM SEALING BY PUTTING CEILING LAYER

FIG. 13
(t') FORM PROTECTIVE FILM
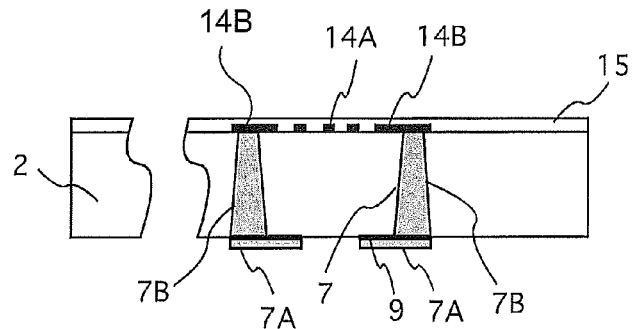
(u') FORM PHOTORESIST AND EXPOSE
PHOTORESIST VIA EXPOSURE MASK
HAVING WIRING OPENING PATTERN
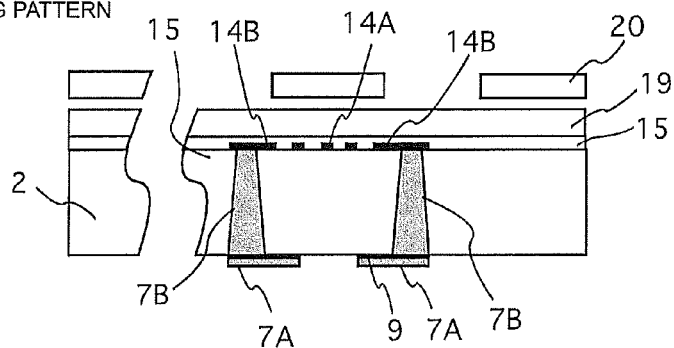
(v') FORM WIRING RESIST OPENING PATTERN
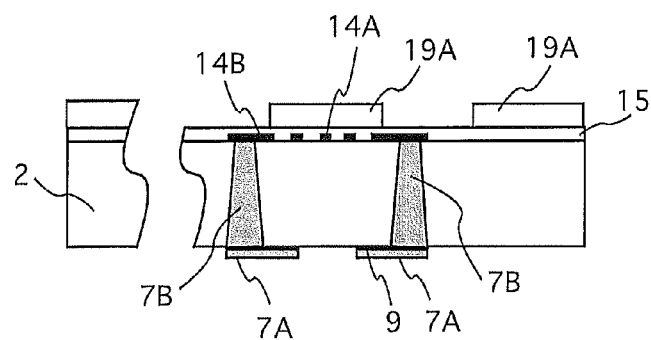

FIG.14
(x) REMOVE PROTECTIVE FILM OF
WIRING RESIST PATTERN BY DRY ETCHING
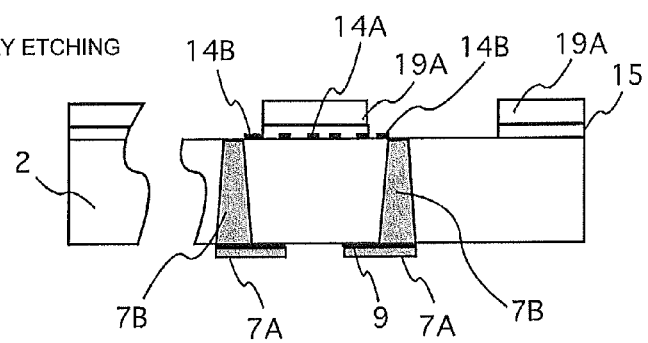
(y) FORM WIRING LAYER
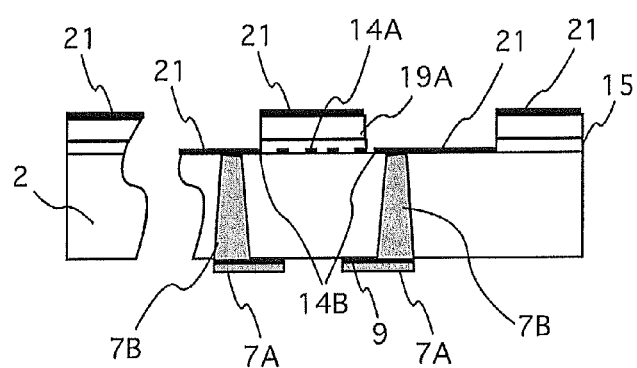
(z) REMOVE RESIST PATTERN AND
UPPER WIRING LAYER BY LIFTOFF
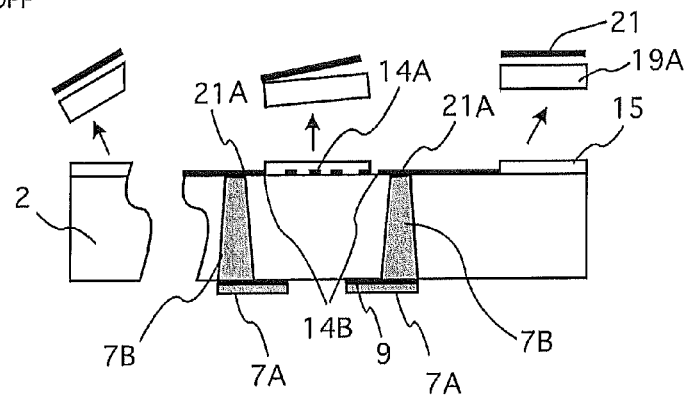

PIEZOELECTRIC DEVICE AND MANUFACTURING METHOD THEREFOR

TECHNICAL FIELD

The present invention relates to a piezoelectric device, and more specifically, relates to a manufacturing method of a piezoelectric device, which realizes standardization of a piezoelectric substrate having an external connection terminal to be provided in the piezoelectric device, and a piezoelectric device manufactured by this method.

BACKGROUND ART

As a piezoelectric device used in various electronic devices represented by mobile communication equipment such as a cell-phone, a surface acoustic wave device (generically referred to as a "SAW device"), which is used as a SAW duplexer or a SAW filter, is generally used. Here, the surface acoustic wave device is explained as a typical example. However, the present invention can also be applied to other similar piezoelectric devices, and further, to various electronic parts in which functions are loaded on an insulating substrate. The surface acoustic wave device is mounted with an interdigital transducer (IDT) generally constituted by comb-shaped electrodes on one surface of a piezoelectric substrate (principal surface, corresponding to "other surface" in the embodiments and Claims described later), and the principal surface is covered with a ceiling layer (sealing layer or a sealing plate) to form a package.

In this type of surface acoustic wave device, a predetermined hollow portion is formed around (generally in an upper layer of) a comb-shaped electrode section (IDT) and the upper layer is sealed by the ceiling layer (sealing layer or sealing plate) together with the piezoelectric substrate, which is supplied to consumers as a packaged parts.

In the packaged parts, an external connection terminal for connection with an electronic device mounted on the piezoelectric substrate side or the ceiling layer side is formed. The external connection terminal is formed as disclosed in, for example, Patent Documents 1 to 3, in such a manner that a through-hole reaching the comb-shaped electrodes side (principal surface) is provided in the piezoelectric substrate or the ceiling layer, and an electrode post (through-hole electrode post) connected to the through-hole is formed to form an external connection electrode in an exposed portion of the through-hole electrode post (on an opposite side to the principal surface of the piezoelectric substrate: rear surface), and after the ceiling layer is stuck to the piezoelectric substrate and sealed, a gold (Au) bump or a solder bump is provided on the external connection electrode, thereby connecting with a terminal of an external circuit. Hereinafter, the external connection electrode may be referred to as an external connection terminal. Specifically, an anisotropic conductive layer or a solder ball is interposed between the external connection terminal and a mounting device or a connection terminal of a device, and is pressure bonded or heated and pressure bonded.

Moreover, in this type of piezoelectric device, rewiring is provided on the principal surface of the piezoelectric substrate, thereby enabling to realize three-dimensional lamination such as Chip to Chip (CTC), Chip to Wafer (CTW), and Wafer to Wafer (WTW).

PRIOR ART DOCUMENTS

[Patent Document 1] Japanese Unexamined Patent Publication No. 2007-81867
[Patent Document 2] Japanese Unexamined Patent Publication No. 2009-225256
[Patent Document 3] Japanese Unexamined Patent Publication No. 2010-10812

SUMMARY OF THE INVENTION

Problems to be Solved by the Invention

In the conventional manufacturing method of a piezoelectric device, a piezoelectric mother substrate (also referred to as a collective substrate or wafer) for forming a plurality of devices simultaneously and the ceiling layer are stuck together, and sealed and packaged, thereby forming an external connection terminal. With such a manufacturing method, there is a decrease in yield rate of the piezoelectric device, for example, deterioration of characteristics due to thermal load to a key area of the device such as the IDT electrode, or damage to a device component layer, occurs in an external connection terminal forming process with respect to a sealed device. Moreover it is a long way from standardization of device parts for realizing an external connection terminal structure that can be diverted to other types of electronic parts having a similar structure, and realization of general versatility has been difficult.

It is an object of the present invention to provide a manufacturing method of a surface acoustic wave device that realizes general versatility by; reducing deterioration of characteristics and a decrease in yield rate of the piezoelectric device such as the surface acoustic wave device in the external connection terminal forming process, and enabling application not only to devices with an IDT as a configuration requirement, but also to other electronic devices having a similar structure, which use a similar insulating substrate, and a piezoelectric device such as a surface acoustic wave device manufactured by this method.

Means for Solving the Problems

In order to achieve the above objects, according to the present invention, before a surface acoustic wave device is sealed in a package, an electrode structure serving as an external connection terminal is provided beforehand on a piezoelectric mother substrate (wafer) mounted with a key area of the device constituted by an IDT electrode, and after the key area of the device is formed, the surface acoustic wave device is packaged and sealed together with a ceiling layer. Thereafter, a gold bump or solder bump for mounting on the electronic device or for connection with other devices is provided on the electrode to perform mounting. In the piezoelectric device of the present invention, a rewiring layer can be provided on a principal surface of the piezoelectric mother substrate so as to accommodate a three-dimensional structure.

Effects of the Invention

According to the manufacturing method of the present invention, characteristic deterioration or a decrease in yield rate of the surface acoustic wave device attributable to process conditions in the manufacturing process is suppressed. Moreover a structure of a piezoelectric substrate with an electrode (through-hole electrode post) for forming an external connection terminal constituting a surface acoustic wave device manufactured by the manufacturing method can be applied to other electronic devices having a similar structure using a similar insulating substrate, thereby facilitating standardization with so-called general versatility of parts being improved. As a result, cost reduction of the surface acoustic wave device as well as various electronic devices having a similar structure can be achieved.

BRIEF DESCRIPTION OF THE DRAWINGS

FIG. 6 is a diagram continuing on from FIG. 5 for explaining the process flow of the manufacturing method of the surface acoustic wave device according to the first embodiment of the present invention.

FIG. 7 is a diagram continuing on from FIG. 6 for explaining the process flow of the manufacturing method of the surface acoustic wave device according to the first embodiment of the present invention.

FIG. 8 is a diagram continuing on from FIG. 7 for explaining the process flow of the manufacturing method of the surface acoustic wave device according to the first embodiment of the present invention.

FIG. 9 is a diagram continuing on from FIG. 8 for explaining the process flow of the manufacturing method of the surface acoustic wave device according to the first embodiment of the present invention.

FIG. 10 is a diagram continuing on from FIG. 9 for explaining the process flow of the manufacturing method of the surface acoustic wave device according to the first embodiment of the present invention.

FIG. 13 is a diagram for explaining a process flow of a relevant part of a manufacturing method of a surface acoustic wave device according to a second embodiment of the present invention.

FIG. 14 is a diagram continuing on from FIG. 13 for explaining the process flow of the relevant part of the manufacturing method of the surface acoustic wave device according to the second embodiment of the present invention.

BEST MODE FOR CARRYING OUT THE INVENTION

A manufacturing method of a piezoelectric device according to the present invention will be explained in an example of manufacturing a surface acoustic wave device. In the manufacturing method of the surface acoustic wave device according to the present invention, an electrode structure such as a through-hole electrode post serving as an external connection terminal, which has conventionally been formed in the last stage of a manufacturing process, is formed in an initial stage of the manufacturing process, and the electrode is used as the external connection terminal.

Figure 1:
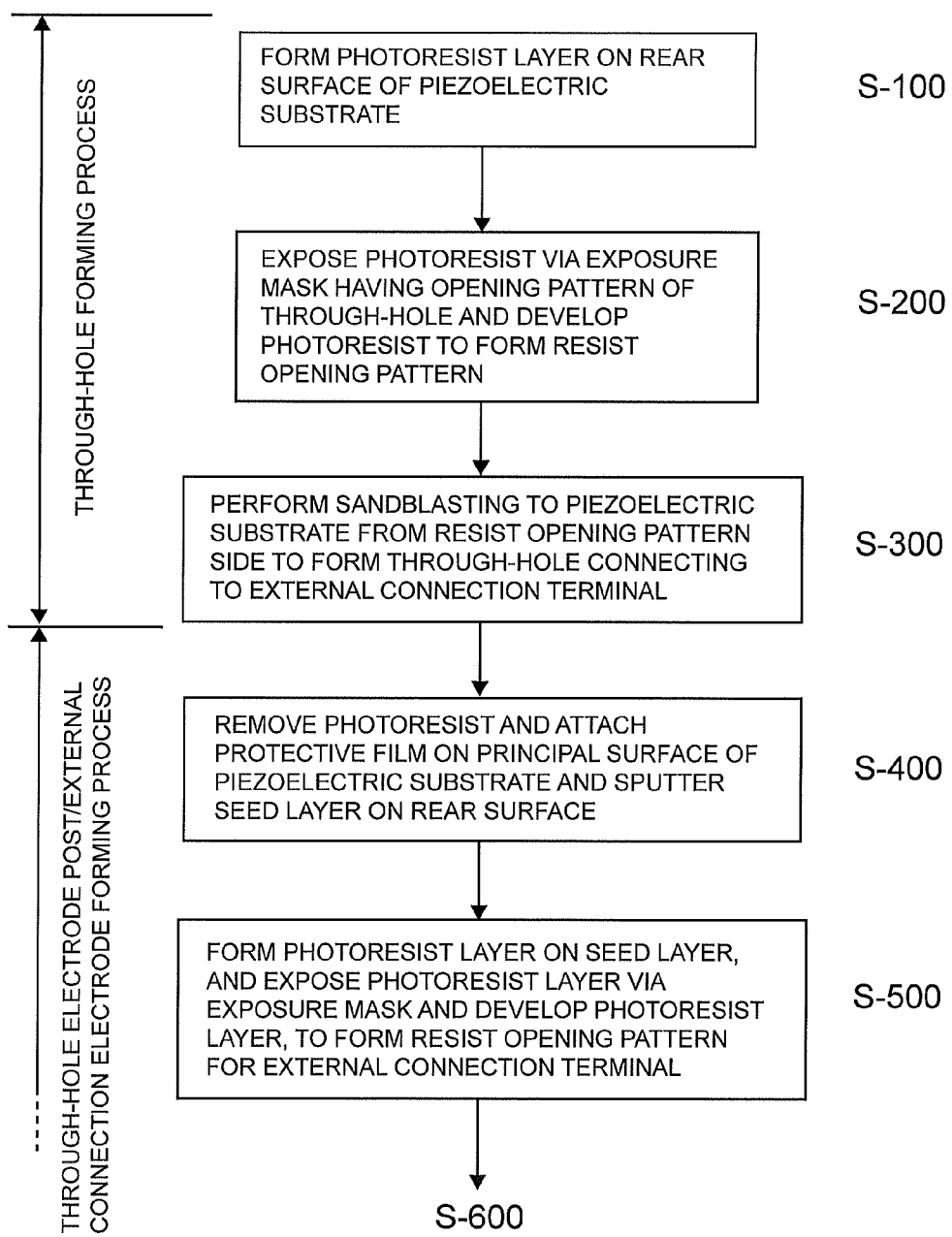
FIG. 1 is a diagram for explaining an outline of a process flow of a manufacturing method of a surface acoustic wave device of the present invention.
Figure 2:
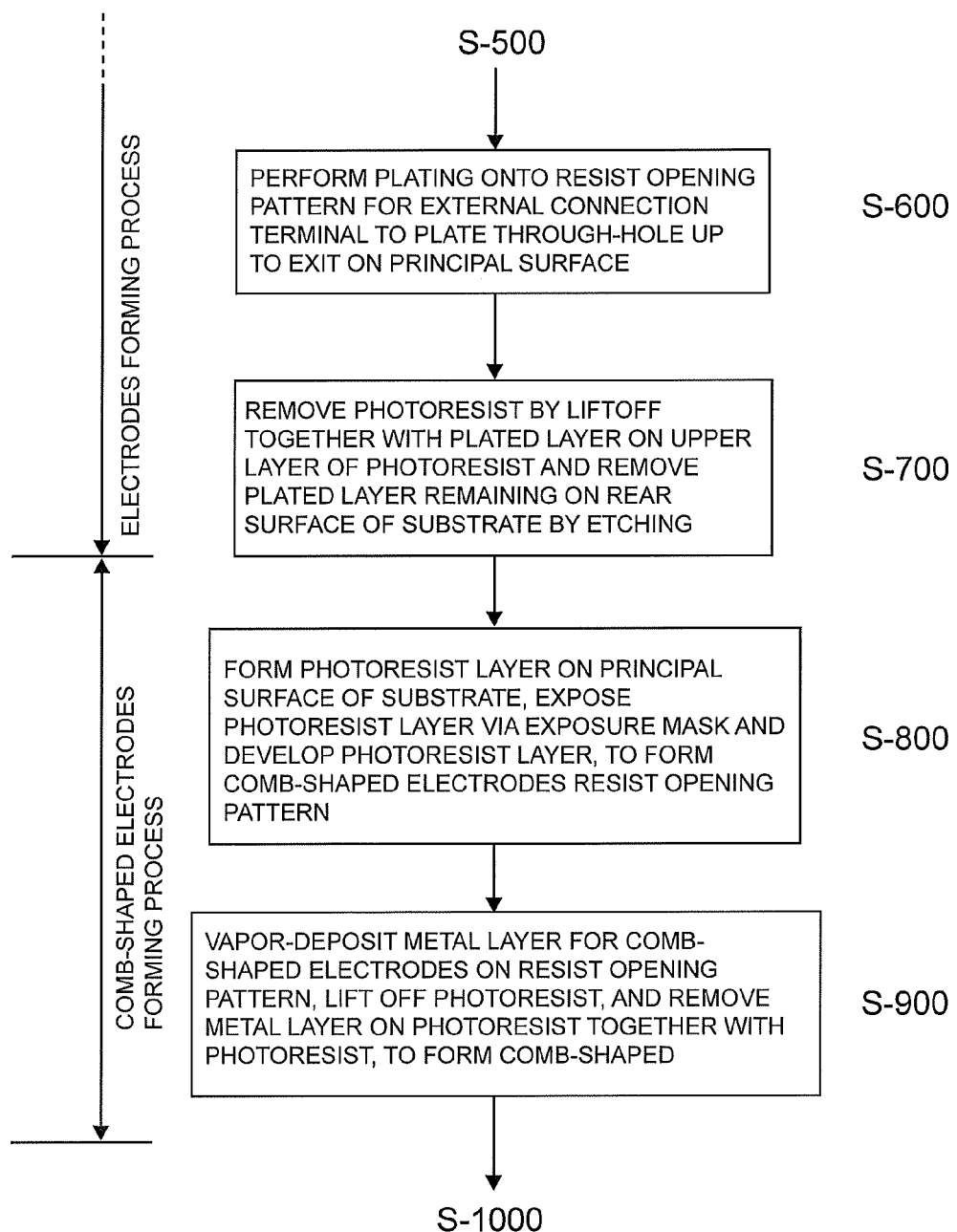
FIG. 2 is a diagram continuing on from FIG. 1 for explaining a basic process flow of the manufacturing method of the surface acoustic wave device of the present invention.
Figure 3:
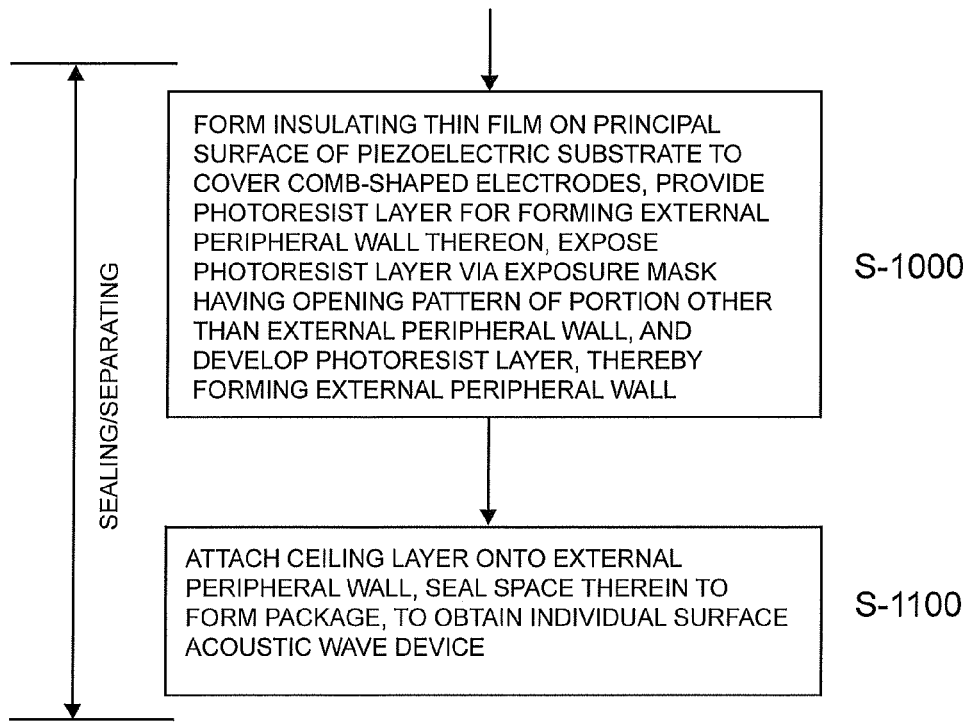
FIG. 3 is a diagram continuing on from FIG. 2 for explaining the basic process flow of the manufacturing method of the surface acoustic wave device of the present invention.

FIG. 1 to FIG. 3 are diagrams for explaining an outline of a process flow of the manufacturing method of the surface acoustic wave device of the present invention. In FIG. 1, first a photosensitive resin layer (hereinafter, also referred to as a photoresist layer or simply as a resist) is formed on one surface (rear surface: a surface of the device on which an external connection terminal is formed) of a collective substrate with the surface thereof being cleaned, that is, a wafer serving as a piezoelectric mother substrate (Step 100, hereinafter, described as S-100). The photoresist layer can be formed by attaching a photoresist sheet or applying a photoresist solution. The same applies to a photoresist forming process.

The photoresist is exposed via an exposure mask having an opening pattern of a through-hole penetrating the piezoelectric mother substrate from one surface (rear surface) to the other surface (principal surface: surface on which the IDT electrode constituted by comb-shaped electrodes serving as the key area of the device is formed) and developed, thereby forming a resist opening pattern (S-200).

Next, sandblasting is performed via the resist opening pattern to form a through-hole for connecting to the external connection terminal (S-300). In the sandblasting, an opening diameter is large on the rear surface side and is small on the principal surface side. In the present embodiment, the sandblasting is used for forming the through-hole. However, other well-known machining methods can be used. The above is a through-hole forming process.

After formation of the through-hole, the photoresist layer is removed, and a protective film is attached or applied to the principal surface of the piezoelectric mother substrate and a seed layer for forming a plated layer in a subsequent stage is sputtered on the rear surface of the piezoelectric mother substrate (S-400).

A photoresist layer is formed on the seed layer, exposed via an exposure mask, and developed, thereby forming a resist opening pattern for an external connection terminal (S-500).

In FIG. 2, the resist opening pattern for the external connection terminal is covered, and plating of a conductive material is performed. Electrolytic plating is preferable for the plating. At this time, plating is performed so that the inside of the through-hole is filled with a plating material to form a column reaching an exit of the principal surface (S-600). A portion plated between the resist opening patterns on the rear surface of the piezoelectric mother substrate becomes an electrode serving as the external connection terminal.

Subsequently, the photoresist is removed. At this time, the plated layer on the photoresist layer is also removed by liftoff together with the photoresist layer. Then, the plated layer remaining in a portion adjacent to each other on the rear surface of the piezoelectric mother substrate is etched and removed (S-700). Wet etching is preferable for the etching. The above is a through-hole electrode post/external connection electrode forming process.

Subsequently, a photoresist layer is formed on the principal surface of the piezoelectric mother substrate, and exposed via an exposure mask, and developed to form a resist opening pattern constituted by openings corresponding to comb-shaped electrodes forming positions (S-800).

A metal layer (aluminum or the like) for the comb-shaped electrodes is vapor-deposited on the resist opening pattern. The metal layer is formed on a bottom part of the openings of the resist opening pattern, that is, on the principal surface of the piezoelectric mother substrate and on the resist. After vapor deposition of the metal layer, the resist layer is peeled off and lifted off from the piezoelectric mother substrate by using a parting agent that swells the photoresist. The metal layer on the photoresist is removed together with the photoresist layer, and only the vapor-deposited metal layer is left on the surface of the piezoelectric mother substrate to form comb-shaped electrodes (S-900). The above is a comb-shaped electrodes foaming process.

In FIG. 3, an insulating protective thin film ($SiO_2$ or the like) is formed on the principal surface of the piezoelectric mother substrate so as to cover the comb-shaped electrodes. A photoresist layer for forming an external peripheral wall is provided thereon, and exposed via an exposure mask having an opening pattern at a position for arranging the external peripheral wall, and developed, thereby forming the external peripheral wall formed of the photoresist layer around the key area of the device (S-1000).

A ceiling layer formed of a resist sheet (or a resist film) similar to the photoresist layer for forming the external peripheral wall is attached onto the external peripheral wall so as to put a cover thereon and seal the space therein, thereby obtaining a plurality of surface acoustic wave devices having the key area including the comb-shaped electrodes in a space between the respective external peripheral walls. Lastly, the piezoelectric mother substrate (wafer) is divided into individual devices, to obtain an individual surface acoustic wave device in which the piezoelectric substrate and the ceiling layer are integrally packaged with the external peripheral wall (S-1100). The above is a sealing/separating process.

After formation of the comb-shaped electrodes, a protective film for protecting the comb-shaped electrodes is formed on the principal surface of the piezoelectric mother substrate, and rewiring can be provided by an exposure and development process by forming a photoresist and using an exposure mask, that is, by a photolithographic method, vapor deposition of a metal layer, and liftoff.

Embodiments of the manufacturing method of the surface acoustic wave device according to the present invention will be explained below with reference to the drawings. Resin patterns to be formed by exposure and development of a photosensitive resin will be described, in respective steps, as a penetrating opening resin pattern, an external terminal opening resin pattern, a comb-shaped opening resin pattern, and the like.

Figure 4:
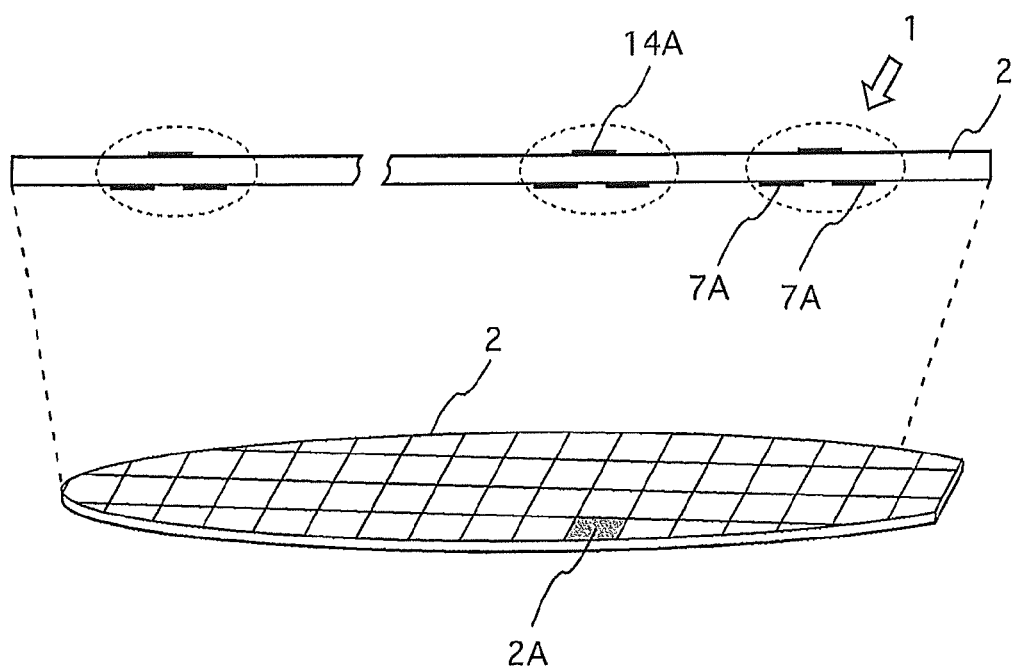
FIG. 4 is an explanatory diagram of a piezoelectric mother substrate, for explaining the manufacturing method of the surface acoustic wave device of the present invention.

FIG. 4 is an explanatory diagram of the piezoelectric mother substrate, for explaining the manufacturing method of the surface acoustic wave device of the present invention. In a surface acoustic wave device 1 shown by a thick arrow, a plurality of key areas (IDT portions) of the device is formed on a piezoelectric mother substrate 2, covered with a ceiling layer, which is divided into individual devices. In FIG. 4, reference number 1 denotes the surface acoustic wave device (which becomes individual devices after division), 14A denotes a key area (IDT portion) of the device, 7A denotes an external connection terminal, and 2A denotes a piezoelectric substrate of the individual surface acoustic wave device.

[First Embodiment]

FIG. 5 to FIG. 11 are diagrams for explaining a process flow of a manufacturing method of a surface acoustic wave device according to a first embodiment of the present invention. The manufacturing method of the surface acoustic wave device according to the present embodiment is explained in sequential processes with reference to the sequence of reference symbols (a), (b), . . . , in FIG. 5 to FIG. 11.

Figure 5:
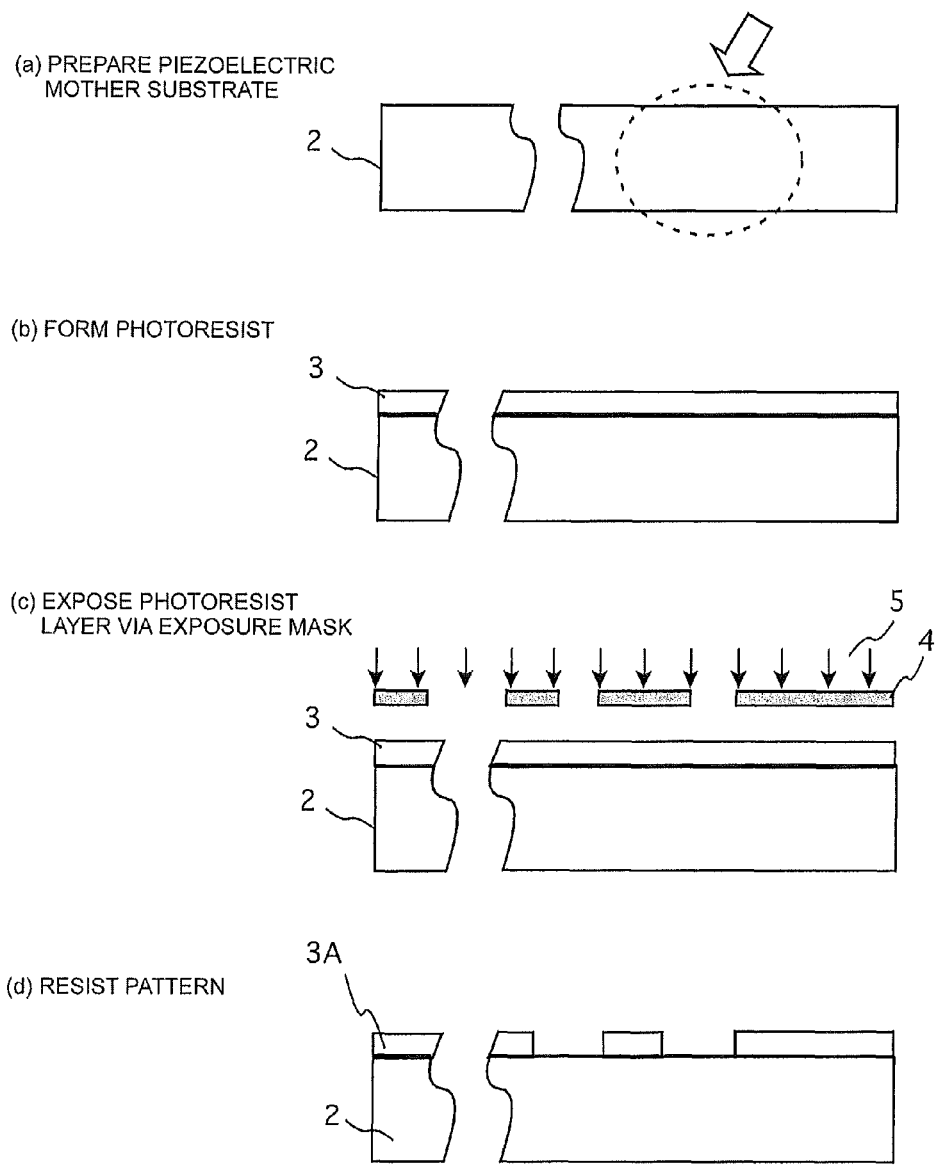
FIG. 5 is a diagram for explaining a process flow of the manufacturing method of the surface acoustic wave device according to a first embodiment of the present invention.

In FIG. 5, (a) the piezoelectric mother substrate 2, which is a collective substrate with the surface thereof being cleaned, is prepared as a wafer. The piezoelectric mother substrate 2 is made of an inorganic material such as lithium tantalite ($LiTaO_3$) or lithium niobate ($LiNbO_3$). The thick arrow shows a portion serving as the surface acoustic wave device after division. (b) A first photosensitive resist (first photoresist) layer 3 is formed on a back surface of the piezoelectric substrate (a mounting surface to an on-board device or the like), which is a rear surface of a completed device. The first photoresist layer 3 is formed by attaching a photoresist sheet (film-like photoresist) to the rear surface of the piezoelectric mother substrate 2 or by applying a photoresist solution to the rear surface of the piezoelectric mother substrate. The same applies to the formation of the photoresist in the respective processes. In the present embodiment, a resist sheet "product code CX-8040" manufactured by Asahi Kasei Corporation was used.

The first photoresist layer 3 is exposed by irradiation of ultraviolet rays (UV) 5 (c) via an exposure mask 4 having an opening pattern of a through-hole to be provided on the piezoelectric mother substrate, and developed to form a resist opening pattern 3A (d). The photoresist used in the present embodiment is a resist of a type in which an exposed portion is soluble in a developer (positive photoresist). When a photoresist of a type in which the exposure portion is not soluble in the developer (negative photoresist) is used, it is assumed that an opening pattern the reverse of that of the exposure mask is formed as the opening pattern of the exposure mask. The same applies to the process below. As the developer, sodium carbonate solution was used.

In FIG. 6, treatment by sandblasting 6 is performed from the resist opening pattern 3A side (e), to form a through-hole 7 that penetrates from the surface on which the external connection terminal provided on the rear surface of the piezoelectric mother substrate 2 is formed, to the principal surface on which the key area of the device including the comb-shaped electrodes is provided. Abrasive grain size #500 was used for sandblasting.

After formation of the through-hole 7, the resist opening pattern 3A is removed (f), and a protective film 8 is attached to the principal surface of the piezoelectric mother substrate 2 (g). In the present embodiment, a polyimide film is used as the protective film 8. Moreover, a seed layer 9 for ensuring excellent adhesiveness with a plated layer is formed on the rear surface of the piezoelectric mother substrate 2 by sputtering (h). The seed layer 9 is formed by sputtering TiW with a film thickness of 750 angstrom (Å) and then sputtering Cu with a film thickness of 4000 Å

In FIG. 7, a second photosensitive resin (second photoresist) layer 10 made of the same material as the first photoresist is formed on the rear surface of the piezoelectric mother substrate 2 on which the seed layer 9 has been sputtered (i), exposed with the ultraviolet rays 5 via an exposure mask 11 having an electrode pattern for the external connection terminal, and developed to form a resist opening pattern 10A for the external connection terminal (j). In the present embodiment, the second photoresist layer 10 is also the positive photoresist.

Cu is formed on the surface on which the resist opening pattern 10A is formed so that the thickness of Cu is equal to or more than 20 micrometers (μm) by electrolytic plating, to form an external connection terminal 7A. The film thickness of the external connection terminal 7A needs to be a thickness capable of ensuring electrical continuity without any damage at the time of performing pressure bonding with respect to a terminal to be mounted, with a solder ball interposed therebetween. Consequently, the thickness of the external connection terminal 7A is set to 20 micrometers or more. Ni—B plating, Pd plating, and gold (Au) plating are applied to the Cu plating in this order (k), and the resist opening pattern 10A is peeled off and removed. Thereafter, the seed layer 9 remaining in a portion of the rear surface excluding the lower layer of the external connection terminal 7A is removed by etching (l).

In FIG. 8, the protective film 8 formed on the principal surface of the piezoelectric mother substrate 2 is peeled off, to prepare a piezoelectric mother substrate (wafer) 2 having a through-hole and an electrode of an external connection terminal (m). A third photosensitive resin (third photoresist) layer 12 is applied to the principal surface of the piezoelectric mother substrate 2 (n). As the third photosensitive resin layer 12, a positive photoresist in which a portion irradiated with ultraviolet rays is hardened and becomes insoluble in a developer (for example, trade name "AZ5214E" manufactured by Hoechst AG) is used. The third photoresist layer 12 is exposed with ultraviolet rays 5 via a third exposure mask 13 having openings at electrode positions 13A of the comb-shaped electrodes (o).

In FIG. 9, the exposed third photoresist is developed to form a photoresist pattern 12A with the photoresist at an electrode forming position of the comb-shaped electrodes being removed (p). An aluminum (Al) thin film 14 is vapor-deposited on the photoresist pattern 12A as a metal film for electrodes (q).

Subsequently, the photoresist pattern 12A is removed by liftoff using a parting agent (r). At the time of removing the photoresist pattern 12A, the aluminum thin film 14 vapor-deposited thereon is removed together with the photoresist pattern 12A, and the aluminum thin film vapor-deposited on the principal surface of the piezoelectric mother substrate 2 remains in the key area of the device, which becomes comb-shaped electrodes 14A. A terminal 14B for a signal input and output is simultaneously formed at the end of the comb-shaped electrodes 14A.

In FIG. 10, $SiO_2$ is applied as a protective film 15 to the principal surface of the piezoelectric mother substrate 2 on which the comb-shaped electrodes 14A are formed (t). A fourth photosensitive resin (fourth photoresist) layer 16 is formed on the protective film 15. A portion, in which an external peripheral wall is to be formed, is exposed with ultraviolet rays (UV) 5 by using an exposure mask 17 having an opening pattern (u), and developed to form an external peripheral wall 16A (v). In the present embodiment, a negative photoresist (for example, trade name "TMMR-S2000" manufactured by Tokyo Ohka Kogyo Co., Ltd.) is used as the fourth photoresist layer 16.

Figure 11:
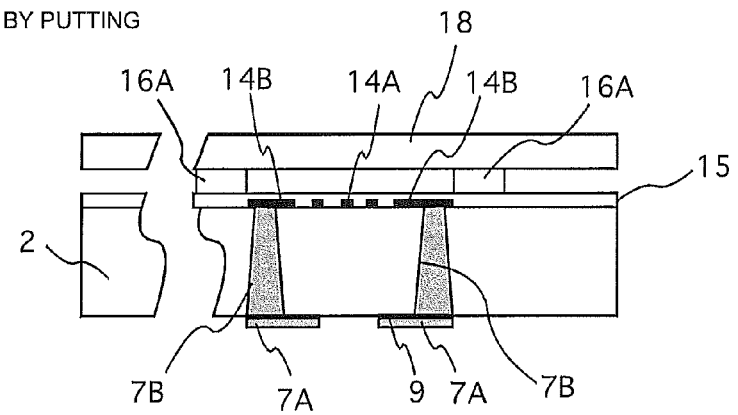
FIG. 11 is a diagram continuing on from FIG. 10 for explaining the process flow of the manufacturing method of the surface acoustic wave device according to the first embodiment of the present invention.

In FIG. 11, the principal surface of the piezoelectric mother substrate 2 is covered, and sealed by putting a ceiling layer 18 of a resin sheet or resin film on the external peripheral wall 16A (w). Bondability between the ceiling layer 18 and the external peripheral wall 16A becomes excellent by using a resin sheet of the same type as the external peripheral wall 16A. However, it is important to ensure a hollow portion for mounting the IDT in the ceiling layer 18, and the material of the ceiling layer 18 needs to avoid squashing or crushing of the hollow portion due to thermo-compression bonding in a sealing process of the ceiling layer 18 and to resist heat in a reflow process. Consequently, in the present embodiment, a resin sheet mixed with tiny foil pieces of glass, so-called glass flakes as a filler is used. As the resin material, heat-resistant and hard resin such as polyimide resin, epoxy resin, and further, densified resin thereof can be used.

The filler to be mixed in the resin is not limited to the glass flakes, and hard and heat-resistant material such as tiny crystal flakes, tiny ceramic flakes, or tiny polycarbonate flakes can be used. Other than the filler in the form of flakes, for example, a filler in the form of beads or fibrous filler can be used. However, in experimental manufacture performed by the present inventor, excellent results could be obtained by the filler in the form of flakes.

The material of the ceiling layer 18 is not limited to the one using the resin as a base material, and an insulating single sheet such as a glass board or a ceramic board can be used. The piezoelectric mother substrate (wafer, that is, collective substrate) 2 manufactured in this manner is divided into individual devices, to obtain a plurality of surface acoustic wave devices.

Figure 12:
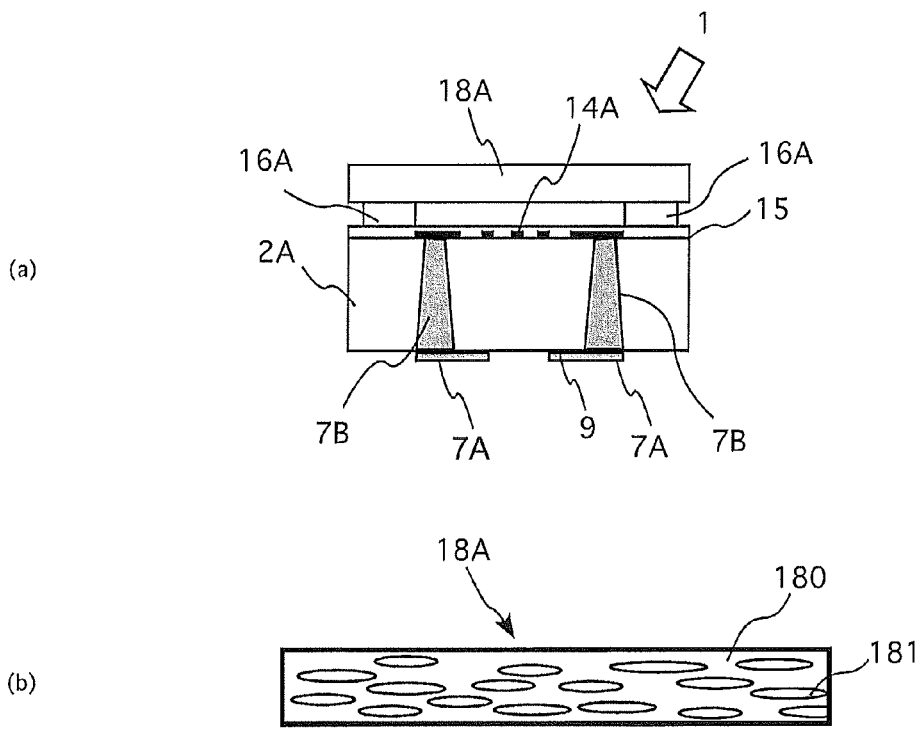
FIG. 12 is an explanatory diagram of the surface acoustic wave device manufactured by the manufacturing method of the surface acoustic wave device according to the first embodiment of the present invention.

FIG. 12 is an explanatory diagram of the surface acoustic wave device manufactured by the manufacturing method of the surface acoustic wave device according to the first embodiment of the present invention. FIG. 12 (a) is a sectional view showing the entire structure, and FIG. 12 (b) is a schematic diagram for explaining the configuration of the ceiling layer in FIG. 12 (a). In FIG. 12 (a), the surface acoustic wave device 1 obtained by dividing the piezoelectric mother substrate into individual devices includes the comb-shaped electrodes (IDT) 14A constituting the key area of the device on the principal surface of a piezoelectric substrate 2A, and includes the signal input and output terminals 14B at the opposite ends thereof. A through-hole electrode post 7B is formed by plating in the through-hole 7 extending from the principal surface to the rear surface of the piezoelectric substrate 2A. The principal surface side of the through-hole electrode post 7B is connected to the signal input and output terminal 14B, and the rear surface side thereof is connected to the external connection terminal 7A.

The protective film 15 is formed so as to cover the key area of the device including the comb-shaped electrodes and the signal input and output terminals 14B thereof provided on the principal surface of the piezoelectric substrate 2A. A ceiling layer 18A is provided on the protective film 15 around the principal surface of the piezoelectric substrate 2A via the external peripheral wall 16A to seal the surface acoustic wave device as a package.

A resin sheet, in which tiny glass flakes 181 serving as the filler are mixed in a high-density epoxy resin 180 as a base material, is used as the ceiling layer 18A shown in FIG. 12 (b) in the present embodiment. It is preferable that the size of the tiny glass flakes is set to about 6 μm to 150 μm in a long axis direction and about 0.1 μm to 0.5 μm in a thickness direction. The mixing ratio of the filler with respect to the base material is preferably set to about 10% to 65% in a volume ratio. The size of the glass flakes and the mixing ratio with respect to the base material are items to be appropriately selected according to the device size of the surface acoustic wave device, specifically, according to the size and thickness of the base material, the volume of the hollow portion, the height of the ceiling, and the like.

In this manner, an electrode structure serving as the external connection terminal is provided beforehand on the piezoelectric substrate, on which the key area of the device including the IDT electrode of the device is mounted, before the surface acoustic wave device is sealed in a package, and the surface acoustic wave device is sealed in a package together with the ceiling layer after the key area of the device is formed. As a result, characteristic deterioration or a decrease in yield rate of the surface acoustic wave device attributable to process conditions in the manufacturing process is suppressed.

[Second Embodiment]

FIG. 13 and FIG. 14 are diagrams for explaining a process flow in a key area of a manufacturing method of a surface acoustic wave device according to a second embodiment of the present invention. In the present embodiment, the process flow in FIG. 13 is partly the same as that in FIG. 10, from step (s) shown in FIG. 9 in which the comb-shaped electrodes 14A and the signal input and output terminal 14B are formed, up to step (t) shown in FIG. 10, which explain the first embodiment, in which the protective film 15 is formed on the principal surface of the piezoelectric mother substrate 2. Hereinafter, the process flow will be explained in the order of reference symbols (t'), (u'), (v') in FIG. 13 and (X) to (Z) in FIG. 14.

In FIG. 13, (t') a fifth photoresist layer 19 is formed on the principal surface of the piezoelectric mother substrate 2 on which the protective film 15 is formed. In the present embodiment, a positive resist is used as the photoresist layer 19. The photoresist layer 19 is exposed with ultraviolet rays (UV) via a fifth exposure mask 20 having an opening of a size including the entire comb-shaped electrodes and the signal input and output terminal excluding a part thereof.

Then, an exposed portion of the photoresist layer 19 is removed by development (u'), and a remaining photoresist pattern 19A is baked for one hour at 250 C.° and hardened (v').

In FIG. 14, the protective film 15, which becomes exposed from the hardened photoresist, is removed by dry etching (x). In the present embodiment, mixed gas of $CF_4$ and $O_2$ is used for dry etching to perform etching treatment for 10 minutes. As a result, the protective film 15 on a part of the adjacent signal input and output terminal (a portion protruding from the photoresist) on the piezoelectric mother substrate (wafer) is removed.

Cr (chromium) and Al (aluminum) are sequentially vapor-deposited on the principal surface, from which the protective film 15 becoming exposed from the hardened photoresist has been removed, to obtain a Cr/Al metal film 21 for rewiring (y). Thereafter, the photoresist pattern 19A is lifted off and removed together with the Cr/Al metal film 21 vapor-deposited on an upper layer (z). As a result, a metal film portion 21A, which becomes a rewiring layer (rewiring layer 23 in FIG. 15 described later) that connects portions of the adjacent signal input and output terminals 14B (portions protruding from the photoresist) on the piezoelectric mother substrate (wafer), is formed.

Figure 15:
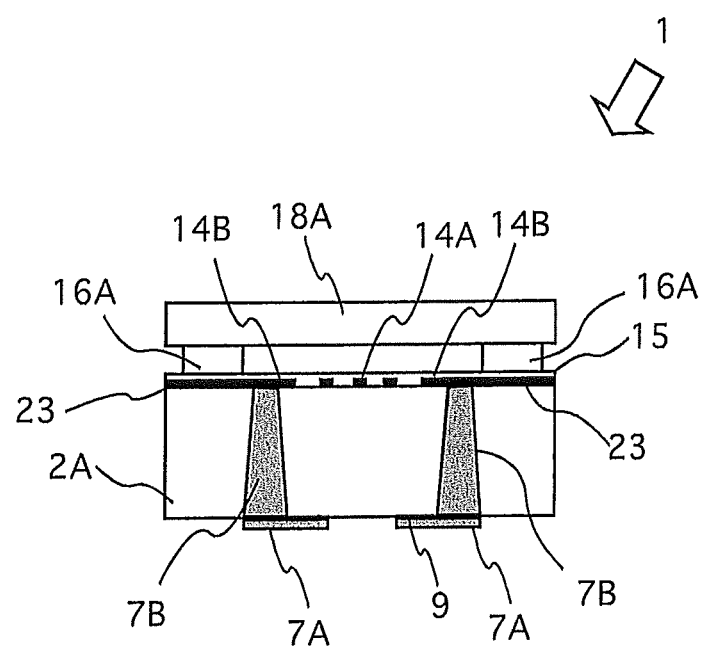
FIG. 15 is a schematic sectional view for explaining the surface acoustic wave device manufactured by the manufacturing method of the surface acoustic wave device according to the second embodiment of the present invention.

FIG. 15 is a schematic sectional view for explaining the surface acoustic wave device manufactured by the manufacturing method of the surface acoustic wave device according to the second embodiment of the present invention. A surface acoustic wave device 1 obtained by dividing the piezoelectric mother substrate into individual devices includes the signal input and output terminals 14B at the opposite ends of the comb-shaped electrodes 14A on the principal surface of the piezoelectric substrate 2A. The surface acoustic wave device 1 includes a wiring layer connected to the signal input and output terminals 14B. The wiring layer (the metal film portion 21A formed in FIG. 14) becomes a rewiring layer 23. A through-hole electrode post 7B is formed by plating in a through-hole extending from the principal surface to the rear surface of the piezoelectric substrate 2A. The principal surface sides of the through-hole electrode posts 7B are connected to the signal input and output terminals 14B and the rear surface sides are connected to the external connection terminals 7A.

The protective film 15 is formed on the rewiring layer 23 connected to the comb-shaped electrodes 14A and the signal input and output terminals 14B provided on the principal surface of the piezoelectric substrate 2A. A ceiling layer 18A is provided on the protective film 15 around the principal surface of the piezoelectric substrate 2A via an external peripheral wall 16A, and the surface acoustic wave device is sealed as a package.

In this manner, an electrode structure serving as the external connection terminal is provided beforehand on the piezoelectric substrate, on which the key area of the device including the IDT electrode of the device and the rewiring layer 23 is mounted, before the surface acoustic wave device is sealed in a package, and the surface acoustic wave device is sealed in a package together with the ceiling layer after the key area of the device is formed. As a result, characteristic deterioration or a decrease in yield rate of the surface acoustic wave device attributable to process conditions in the manufacturing process is suppressed.

Figure 16:
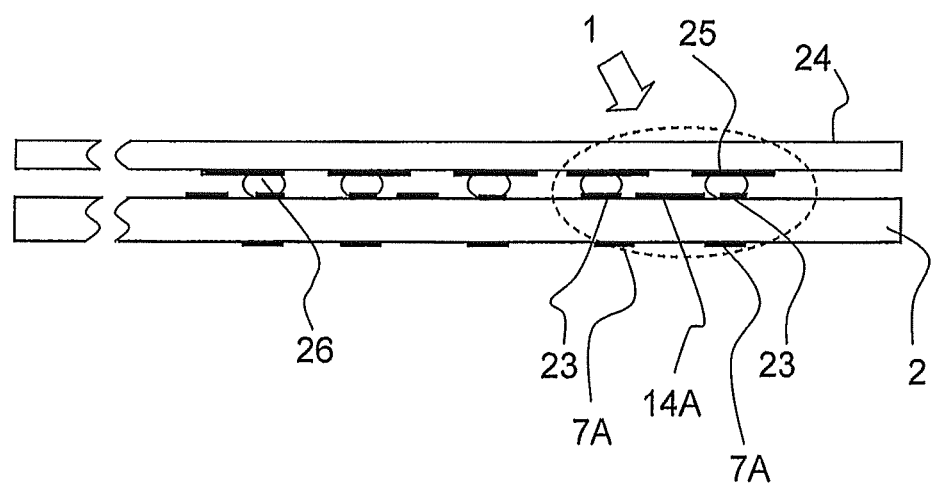
FIG. 16 is a schematic sectional view for explaining a configuration example in a wafer stage of the surface acoustic wave device manufactured by the manufacturing method of the surface acoustic wave device according to the second embodiment of the present invention.

FIG. 16 is a schematic sectional view for explaining a configuration example in a wafer stage of the surface acoustic wave device manufactured by the manufacturing method of the surface acoustic wave device according to the second embodiment of the present invention. The rewiring layer 23 formed on the principal surface of the piezoelectric mother substrate 2 is pressure bonded or heated and pressure bonded to a rewiring layer 25 on another piezoelectric mother substrate (wafer) 24 via a solder ball 26 disposed therebetween. The surface acoustic wave device 1 shown by the thick arrow, is obtained by forming a plurality of key areas of the device (IDT portion) on the piezoelectric mother substrate 2, covering it with a ceiling layer, and dividing it into individual devices.

A bump for stress relief can be provided on the rewiring layer 25 formed on the principal surface of the piezoelectric mother substrate 2 and a solder ball 26 can be interposed between the bump and the rewiring layer 25 on another substrate wafer 24, to perform pressure bonding or heating pressure bonding. A copper (Cu) layer can be used as the bump 23.

In the respective embodiments described above, the other substrate wafer 24 can be a piezoelectric mother substrate constituting the surface acoustic wave device according to the present invention, or some other similar substrate wafer and semiconductor bare chip, or other device substrates or other devices. A high density device such as so-called 3D lamination can be easily realized by adopting such a structure.

Industrial Applicability

The present invention can be applied not only to various electronic devices but to various electronic devices, so long as the electronic device has a hole such as via hole for realizing electrical connection with an external connection terminal or other substrates.

What is claimed is:

1. A piezoelectric device having a piezoelectric substrate, a ceiling layer, and an external peripheral wall provided around a key area of said piezoelectric substrate and interposed between said piezoelectric substrate and said ceiling layer, wherein a through-hole is provided in one surface of said piezoelectric substrate so as to reach the other surface of said piezoelectric substrate, a through-hole electrode post connecting said one surface and said other surface through said through-hole is formed, comb-shaped electrodes constituting said key area, and signal input and output terminals connected to opposite ends of said comb-shaped electrodes, are provided on the other surface of said piezoelectric substrate, and an external connection terminal is connected to the one surface of said through-hole electrode post, wherein said ceiling layer comprises a high-density epoxy resin sheet or film as a base material containing glass flakes as a filler therein, where said glass flakes are directed to arrange in the same direction, the size of said glass flakes is set to a range of 6 μm to 150 μm in a long axis direction, 0.1 μm to 0.5 μm in a thickness direction and the mixing ratio of said filler with respect to said base material is set to a range of 40% to 65%.

2. A piezoelectric device having a piezoelectric substrate, a ceiling layer, and an external peripheral wall provided around a key area of said piezoelectric substrate and interposed between said piezoelectric substrate and said ceiling layer, wherein a through-hole is provided in one surface of said piezoelectric substrate so as to reach the other surface of said piezoelectric substrate, a through-hole electrode post connecting said one surface and said other surface through said through-hole is formed, comb-shaped electrodes constituting said key area, signal input and output terminals connected to opposite ends of said comb-shaped electrodes, and a wiring layer for rewiring are provided on the other surface of said piezoelectric substrate, and an external connection terminal is connected to the one surface of said through-hole electrode post, wherein said ceiling layer comprises a high-density epoxy resin sheet or film as a base material containing glass flakes as a filler therein where said glass flakes are directed to arrange in the same direction, the size of said glass flakes is set to a range of 6 μm to 150 μm in a long axis direction, 0.1 μm to 0.5 μm in a thickness direction and the mixing ratio of said filler with respect to said base material is set to a range of 40% to 65%.

* * * * *